(12) United States Patent
Andre

(10) Patent No.: US 6,445,225 B2
(45) Date of Patent: Sep. 3, 2002

(54) LINE DRIVER WITH VARIABLE POWER

(75) Inventor: Tore Andre, Alvsio (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/769,493

(22) Filed: Jan. 26, 2001

Related U.S. Application Data

(60) Provisional application No. 60/178,733, filed on Jan. 28, 2000.

(51) Int. Cl.[7] .................................................. H02M 3/07
(52) U.S. Cl. ........................ 327/112; 327/62; 327/530; 307/46; 307/405
(58) Field of Search .......................... 327/62, 108, 112, 327/530, 544, 545, 546; 326/80, 81; 307/44, 46, 63, 77, 405; 330/267, 297

(56) References Cited

U.S. PATENT DOCUMENTS

| | | |
|---|---|---|
| 5,262,934 A | 11/1993 | Price |
| 5,339,236 A | 8/1994 | Tamagawa .................... 363/59 |
| 5,423,078 A | 6/1995 | Epperson et al. |
| 6,028,486 A | * 2/2000 | Andre ......................... 330/297 |

FOREIGN PATENT DOCUMENTS

| | | | |
|---|---|---|---|
| EP | 0054943 | 6/1982 | .......... H03G/3/217 |
| EP | 0195500 A | 9/1986 | |
| EP | 0862260 | 9/1998 | ............ H02M/3/07 |
| WO | WO94/11799 | 5/1994 | ........... G05F/1/613 |
| WO | WO99/18662 | 4/1999 | ............. H03F/1/02 |

* cited by examiner

Primary Examiner—Timothy P. Callahan
Assistant Examiner—Terry L. Englund
(74) Attorney, Agent, or Firm—Burns, Doane, Swecker & Mathis, L.L.P.

(57) ABSTRACT

A line driver supplied with a power supply voltage from a power supply uses whole or part of the power supply voltage to generate the output voltage if the input voltage is within a predefined range; loads at least one capacitor with at least one capacitor voltage; and uses whole or part of the at least one capacitor voltage in addition to whole or part of the power supply voltage to generate the output voltage if the input voltage is outside the predefined range.

20 Claims, 6 Drawing Sheets

LINE DRIVER WITH VARIABLE POWER

This application claims the benefit of U.S. provisional application No. 60/178,733, filed Jan. 28, 2000.

TECHNICAL FIELD OF THE INVENTION

The present invention relates to a line driver and an amplifying method in said line driver.

DESCRIPTION OF RELATED ART

Multi-carrier modulation is a known method for transmitting broadband information (for example, video, Internet or telephony) over radio connections or copper wire. The latter may be e.g. xDSL systems, such as Asymmetric Digital Subscriber Line (ADSL), High-rate Digital Subscriber Line (HDSL) or Very high speed asymmetric Digital Subscriber Line (VDSL). Two similar methods in multi-carrier modulation are Orthogonal Frequency Division Multiplex (OFDM), used in radio applications, and Discrete Multitone (DMT), which is used in copper wires.

Very briefly explained, the bits that are to be transmitted, (of for example a digitally encoded video signal) are encoded as complex numbers in a transmitter. In the transmitter an Inverse Fast Fourier Transform (IFFT) and a digital-to-analogue conversion are carried out whereupon the result is sent out on a line to a receiver.

The IFFT-modulation gives a sum of orthogonal carriers or tones, the amplitudes and phase displacement of which are determined by the values and phases of the complex numbers. These carriers are then transmitted in time slots at constant time intervals and are called symbols. In the receiver an analogue-to-digital conversion and a Fast Fourier Transform (FFT) are carried out instead. In this way, the original bits are retrieved. Attenuation and phase displacement may be easily compensated for, by multiplication by a complex number for each carrier.

In an xDSL system there is a line driver after the digital-to-analogue conversion in the transmitter. Said line driver is an amplifier that feeds the line. Since the output from the IFFT-modulation approximately is Gaussian distributed, the peak-to-average ratio is very high. This means that the line driver must have a high supply voltage in order to adequately transmit the occasional high signal peaks that may occur.

Unfortunately, such a high supply voltage results in substantial power dissipation in the line driver. In fact, e.g. in a typical commercial ADSL-system, about 67% of the total power is consumed in the line driver. Thus, there is a need to reduce the power dissipation in such a line driver. Power dissipated in digital logic will be possible to reduce in the future by improved semiconductor technology, but physical laws limits the possibilities to reduce the power in the line driver.

In WO99/18662 reduced power dissipation is achieved by using several power supplies to the line driver. In the first embodiment two different positive power supplies are used, which provide power at first and second levels, respectively, where the second level is greater than the first level. A controller causes power to be supplied from the first power supply to the line driver when the magnitude of the input voltage is less than or equal to a predetermined threshold. When the magnitude of the input voltage is greater than the threshold, the controller causes power to be supplied from the second power supply to the line driver.

The problem with this embodiment is that when the amplifier is in an idle mode, it will take an idle voltage in the middle of the voltage range. Idle voltage is in the present description defined as the voltage that is received on the output of the line driver when there is no input signal to it. This is mainly applicable in circuits that are connected differential or in circuits that are AC-connected.

Thus, if the power supply voltage presently used is 5V, then the idle voltage will be 2,5V and if the power supply voltage presently used is 12V, then the idle voltage will be 6V. Hence, the idle voltage differs depending on which power supply voltage it is that is presently used. This is bad, because then the output voltage will change when the power supply voltage is changed, even though it is supposed to be an idle mode. Another problem is that it is necessary to use two different power supplies, which is expensive, inefficient and place consuming.

The second embodiment in WO99/18662 uses four power supplies, two positive and two negative of corresponding values. This makes the idle voltage at zero at all times. The problem with this embodiment is that as many as four different power supplies are needed.

SUMMARY

The purpose with the present invention is to provide a line driver, such as a line driver in a multi carrier system, with a low power dissipation and a stable idle voltage without having. to use a lot of different power supplies.

The problems mentioned above with the different embodiments WO99/18662 are solved by defining a voltage range, within which it is the greatest probability that the input voltage to the line driver will fall. A power supply to the line driver is chosen accordingly and whole or part of the power supply voltage is used for generating the output voltage as long as the input voltage is within said range.

Further, a capacitor is included in the line driver and is loaded to a capacitor voltage. Whole or part of said capacitor voltage may then be used in addition to whole or part of the power supply voltage to generate the output voltage when the input voltage is outside said range.

The advantages are that a low power dissipation and a stable idle voltage is achieved in a simple circuit without the need for many power supplies. The larger the differences of probability are within the range compared to outside the range the larger is the gain of lowered power dissipation. This is particularly evident in e.g. systems with Gaussian distributed input voltage probabilities, such as is the case for a line driver in a multicarrier system.

BRIEF DESCRIPTION OF THE DRAWINGS

The features and advantages of the present invention outlined above are described more fully below in the detailed description in conjunction with the drawings where like reference numerals refer to like elements throughout.

DETAILED DESCRIPTION OF EMBODIMENTS

Figure 1:
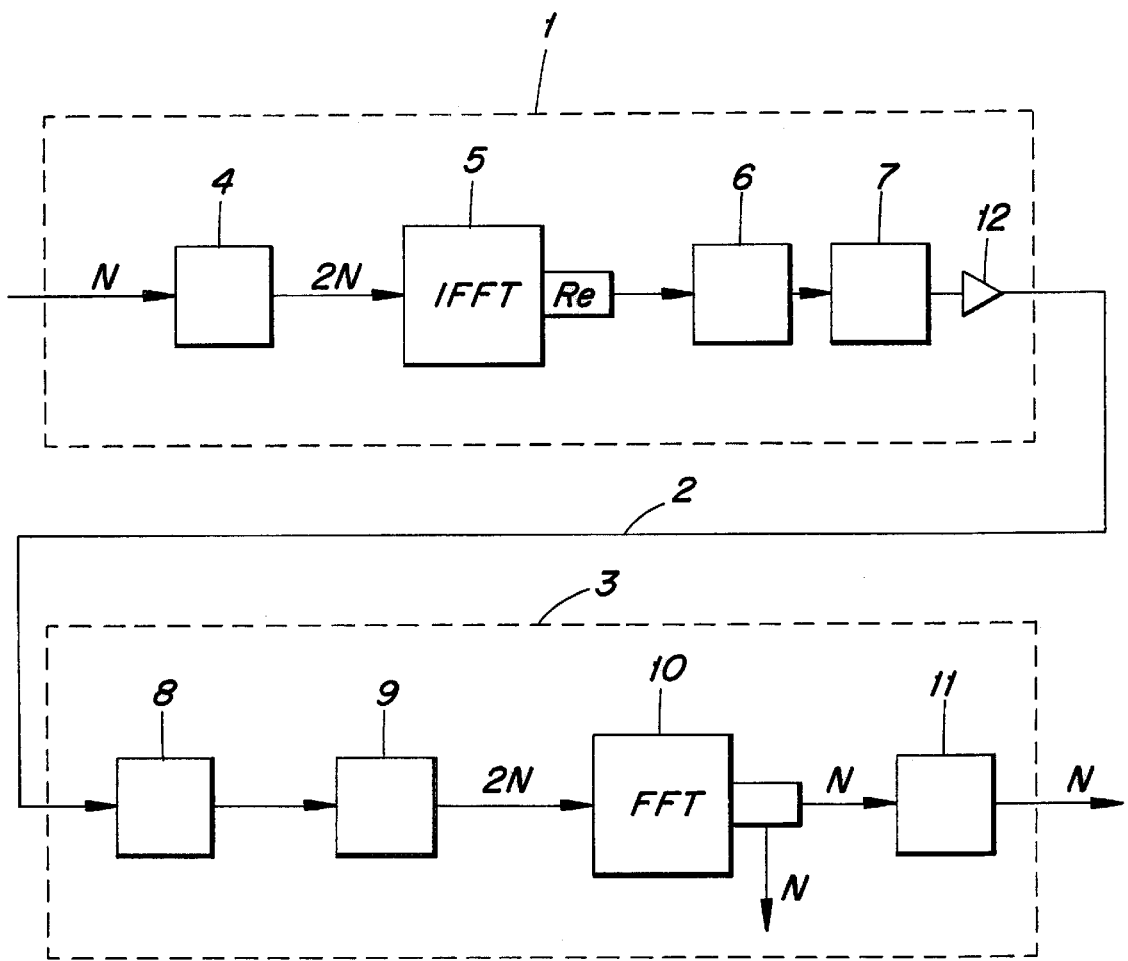
FIG. 1 is a function block diagram showing an example multi-carrier modulation system in which the present invention may be employed.

FIG. 1 shows, schematically, how the main parts of a prior art system for multi-carrier modulation may look. In a transmitter 1 modulation of data bits, for example from a digitally encoded video signal, is performed.

The bits to be transmitted are encoded in the transmitter 1 as N complex numbers before a hermit symmetry operation is carried out in a calculation block 4. 2N complex numbers are obtained having a symmetric real part and an asymmetric imaginary part.

An Inverse Fast Fourier Transform (IFFT) is then performed in an IFFT calculation unit 5, as a modulation. Since the imaginary part becomes zero it may be eliminated and a real signal remains, which passes a parallel to serial converter 6, a digital-to-analogue converter 7 and a line driver 12.

This gives a sum of orthogonal carriers or tones, the amplitudes and phases of which are determined by the values and phases of the original complex numbers. These carriers are then transmitted in a line 2 at constant time intervals/time slots and are called symbols.

In a receiver 3 the data, in the opposite way, passes an analogue-to-digital converter 8, a serial-to-parallel converter 9 and an FFT calculation unit 10, in which an FFT is carried out, as a demodulation. This gives 2N complex numbers. For symmetry reasons, for example the upper half of the 2N complex numbers may be discarded, leaving a number N of complex numbers.

Finally, an equalizer 11 is used, which compensates for attenuation and phase displacement by multiplying the different numbers with complex numbers so that finally the same data bits are obtained that were transmitted to begin with.

Figure 2A:
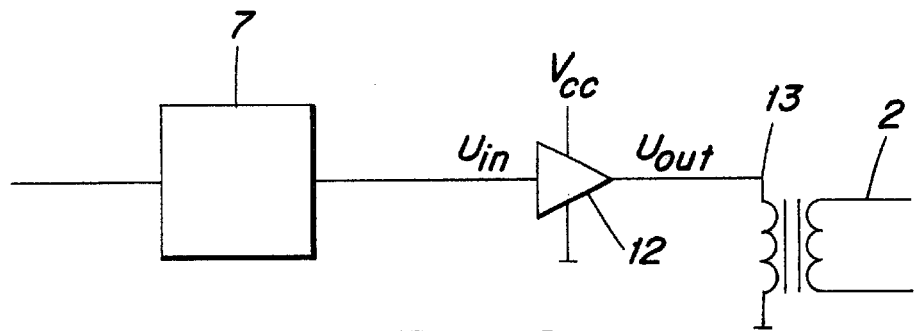
FIGS. 2a and 2b are simplified illustrations of a line driver in a digital subscriber line environment.
Figure 2B:
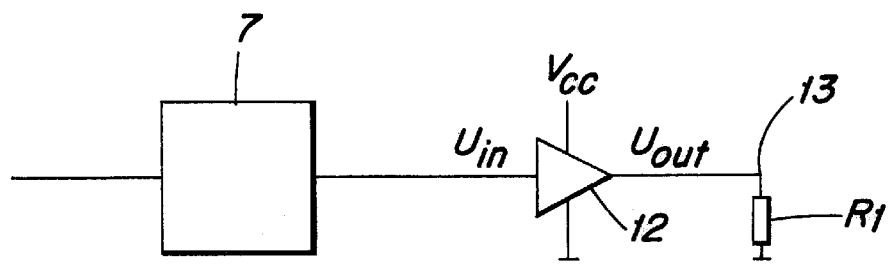

In FIG. 2*a* a line driver 12 is shown. A modulated input voltage $U_{in}$ from the digital-to-analogue converter 7 is fed into the line driver 12, which is an amplifier supplied with a power supply voltage $V_{cc}$. The line driver 12 produces an output voltage $U_{out}$ to a transformer 13, which feeds the line 2. From the point of view of the line driver 12 it may be seen as there is a resistive load $R_L$ on the output of the line driver 12, which is schematically shown in FIG. 2*b*.

Power dissipation $P_d$ is the power that results in heating the line driver 12 and may be characterised in accordance with the following equation:

$$P_d = (V_{cc} - U_{out}) \cdot U_{out}/R_L + P_f \quad (1)$$

The parameter $P_f$ is a technology dependent power that may be possible to reduce in the future if new semiconductor technology is invented. It is however also partly dependent on the power supply voltage $V_{cc}$. The rest of the power dissipation $P_d$ can only be reduced with a lower power supply voltage $V_{cc}$. However, the lower power supply voltage $V_{cc}$ you use, the lower the clipping limit will be and the more disturbances will be in the transmitted signal.

Figure 3:
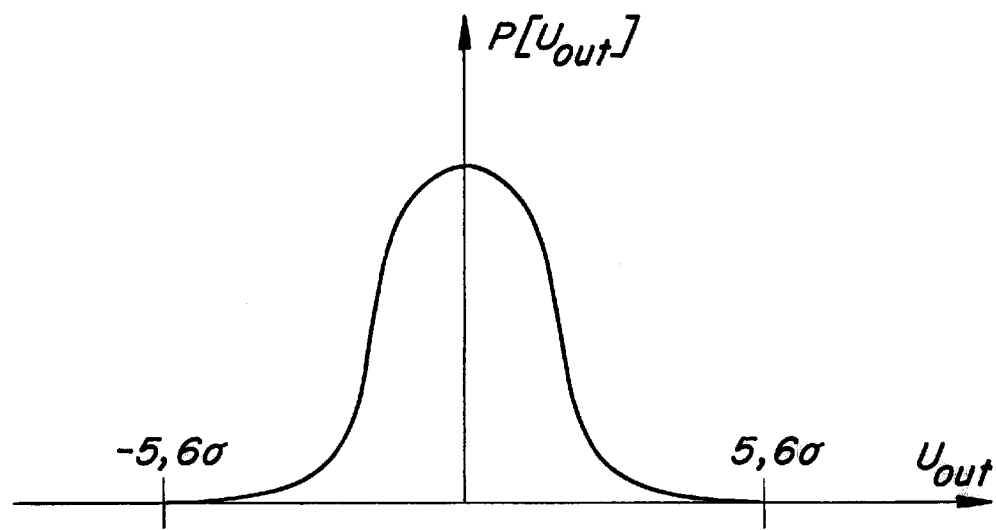
FIG. 3 is a graph showing a Gaussian distribution of multi-carrier modulator output voltages.

The output voltage $U_{out}$ from a transmitter in a DMT, OFDM or similar system is approximately Gaussian distributed, see FIG. 3, i.e. it follows approximately the density function:

$$P(U_{out}) = \frac{1}{\sigma\sqrt{2\pi}} e^{-(U_{out}-m)^2/2\sigma^2} \quad (2)$$

where the parameter m is a measure on where the peak of the curve is and the parameter σ is a measure on the shape of the peak. Both parameters m, σ are dependent on the application.

If, as an example, a low probability of clipping of $10^{-8}$ is accepted, then the clip level will be at approximately 5,6σ a and thus the supply voltage $V_{cc}$ must be at least 5,6σ.

However, one may note that most of the time the output signal $U_{out}$ will be in the mid-range. It would thus be desirable to have a solution where a lower supply voltage is used most of the time and a high supply voltage is used only when it is strictly necessary. That would reduce the overall power dissipation in the line driver.

Figure 4A:
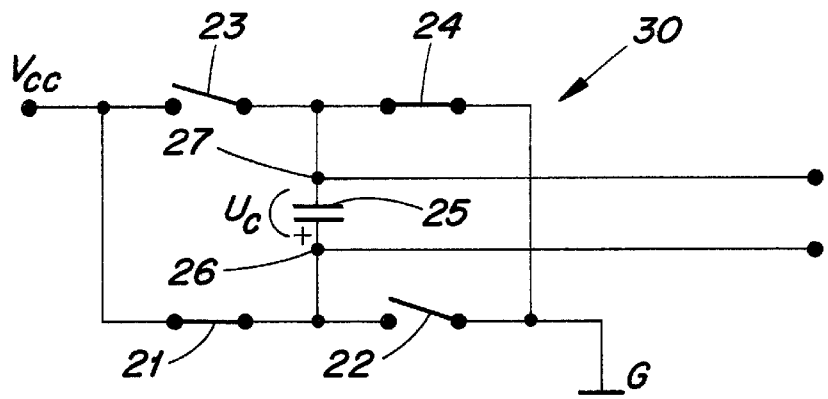
FIGS. 4a–c is a circuit diagram showing a voltage-generating block according to the present invention.
Figure 4B:
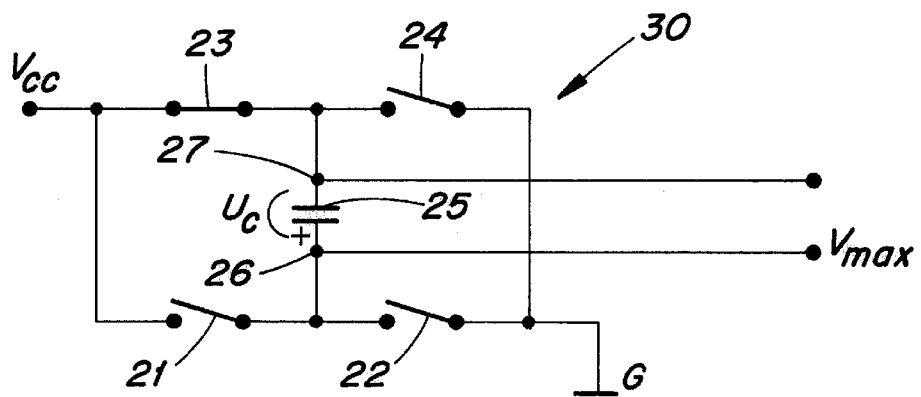
Figure 4C:
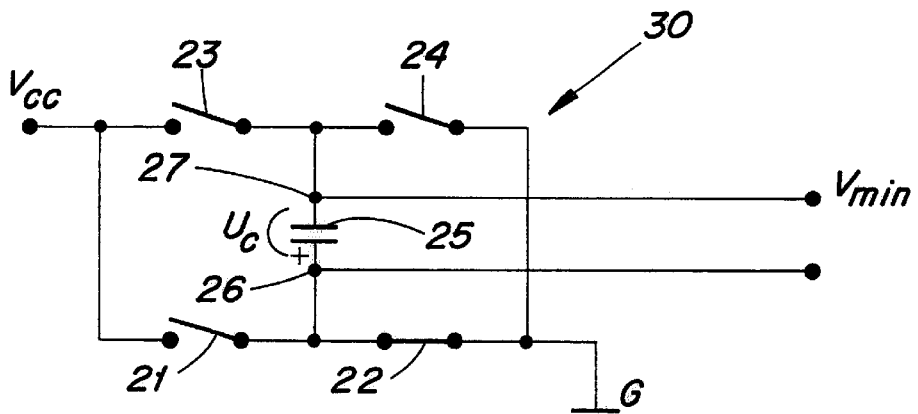

In FIGS. 4*a*–*c* is shown a part of the invention in the form of a voltage generating block 30, which makes it possible to generate different magnitudes of output voltage, without having to use many power supplies. A first 21 and a second 22 switch are connected in series between a power supply $V_{cc}$ and ground G. In parallel with the first 21 and second 22 switches a third 23 and fourth 24 switch are connected in the same way. A capacitor 25 is connected on one side to a first connection point 26 between the first 21 and the second 22 switch. On the other side the capacitor 25 is connected to a second connection point 27 between the third 23 and the fourth 24 switch. A capacitor voltage $U_c$ is indicated over the capacitor 25 between the first 26 and second 27 connection point. The switches 21, 22, 23, 24 may preferably be switch-transistors.

To load the capacitor 25 the switches 21, 22, 23, 24 are switched as in FIG. 4*a*. The first 21 and the fourth 24 switch are closed, while the second 22 and the third 23 switch are open. This loads the capacitor 25 and the capacitor voltage $U_c$ becomes approximately equal to the supply voltage $V_{cc}$ minus losses in the switches 21, 24 and other losses.

When a positive voltage higher than the supply voltage $V_{cc}$ is going to be used, the first 21 and the fourth 24 switch are opened, while the third switch 23 is closed, as in FIG. 4*b*. Then it is possible to take out a first voltage $V_{max}$ between the first connection point 26 and ground G. The output voltage $V_{max}$ is approximately equal to $2 \cdot V_{cc}$, due to the fact that the capacitor voltage $U_c \approx V_{cc}$ is added to the supply voltage $V_{cc}$.

Of course the capacitor 25 will discharge, but if the double voltage only is used under a short time and the capacitor 25 then is recharged, the capacitor voltage $U_c$ will not drop very much. This condition is fulfilled if voltage peaks are not coming very often, as is the case in e.g. multi-carrier systems.

If instead a negative voltage is needed after loading, then the first 21 and the fourth 24 switch are opened, while the second switch 22 is closed, as in FIG. 4*c*. Then it is possible to take out a second voltage $V_{min}$ between the second connection point 27 and ground G. The second voltage $V_{min}$ is approximately equal to $-V_{cc}$, due to the fact that the capacitor voltage $U_c \approx V_{cc}$.

Thus, a voltage interval of $V_{min}$ to $V_{max}$, i.e. $-V_{cc}$ to $2V_{cc}$, is obtained. This makes the idle voltage at $V_{cc}/2$, independently of the magnitude of the output voltage.

An alternative to the embodiment in FIGS. 4*a*–*c* is to use two capacitors, i.e. a first capacitor for positive output voltages larger than the idle voltage and a second capacitor for positive voltages smaller than the idle voltages and for negative voltages.

Figure 5:
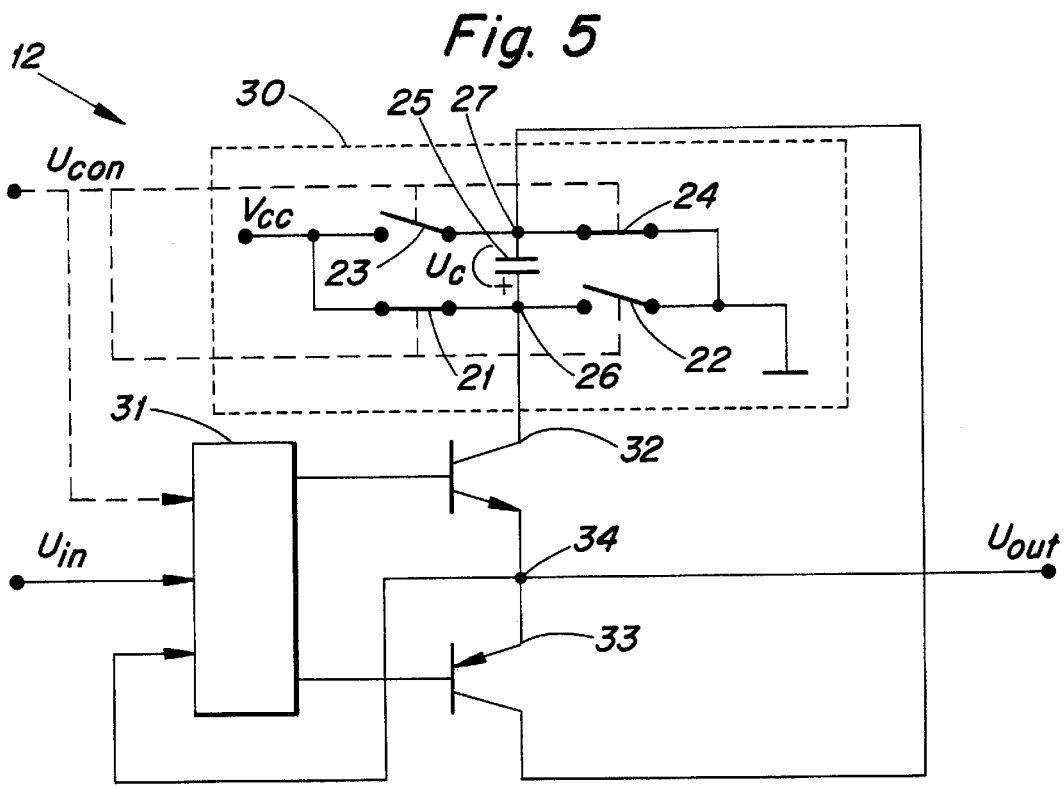
FIG. 5 is a circuit diagram showing a first embodiment of a line driver according to the present invention.

One example on how the embodiment with one capacitor may be implemented in practice in a line driver is shown in FIG. 5. The input signal $U_{in}$, goes into a drive stage 31. A first transistor 32 and a second transistor 33 are connected with their respective bases to the output side of the drive stage 31. The voltage-generating block 30 from FIG. 4a–c has its first connection point 26 connected to the collector of the first transistor 32 and its second connection point 27 connected to the collector of the second transistor 33. Further, the emitters of the two transistors 32, 33 are connected in a third connection point 34. The output voltage $U_{out}$ is taken out from said third connection point 34.

When a positive output voltage higher than the idle voltage is needed then the first transistor 32 leads, but the second transistor 33 does not lead. When a positive output voltage lower than the idle voltage or a negative output voltage is needed then the second transistor 33 leads, but the first transistor 32 does not lead. In both cases the magnitude of the output voltage $U_{out}$ is controlled from the drive stage 31 via the base current to the transistor 32, 33 in use.

When a positive output voltage higher than the supply voltage is needed, then the switches are switched as described in FIG. 4b and the first voltage $V_{max}$ may be taken out from the first connection point 26. Thus, the output signal $U_{out}$ may become a value up to approximately the first voltage $V_{max}$.

When a positive output voltage lower than the supply voltage or a negative output voltage is needed, then the switches are switched as described in FIG. 4c and the second voltage $V_{min}$ may be taken out from the second connection point 27. Thus, the output signal $U_{out}$ may become a value to approximately the second voltage $V_{min}$.

In the figure the first transistor is an NPN-transistor and the second transistor is a PNP-transistor. This is only an example. The man skilled in the art can easily use other transistors or equivalent means, to get the same function.

One or more control signals may be employed in order to control when and how the switches are going to switch and to control how the drive stage is to control the base currents when the voltage-generating block 30 is used and not, respectively.

Further, the output signal $U_{out}$ may be fed back to the input side of the drive stage 31 and be used to ensure that the output signal $U_{out}$ is a linear function of the input signal $U_{in}$.

One advantage with the embodiment in FIG. 5 is that it is simple and that only two transistors need to be used. One disadvantage is that the current always has to pass switches also when no peak voltages are needed, with following losses in the switches.

Figure 6:
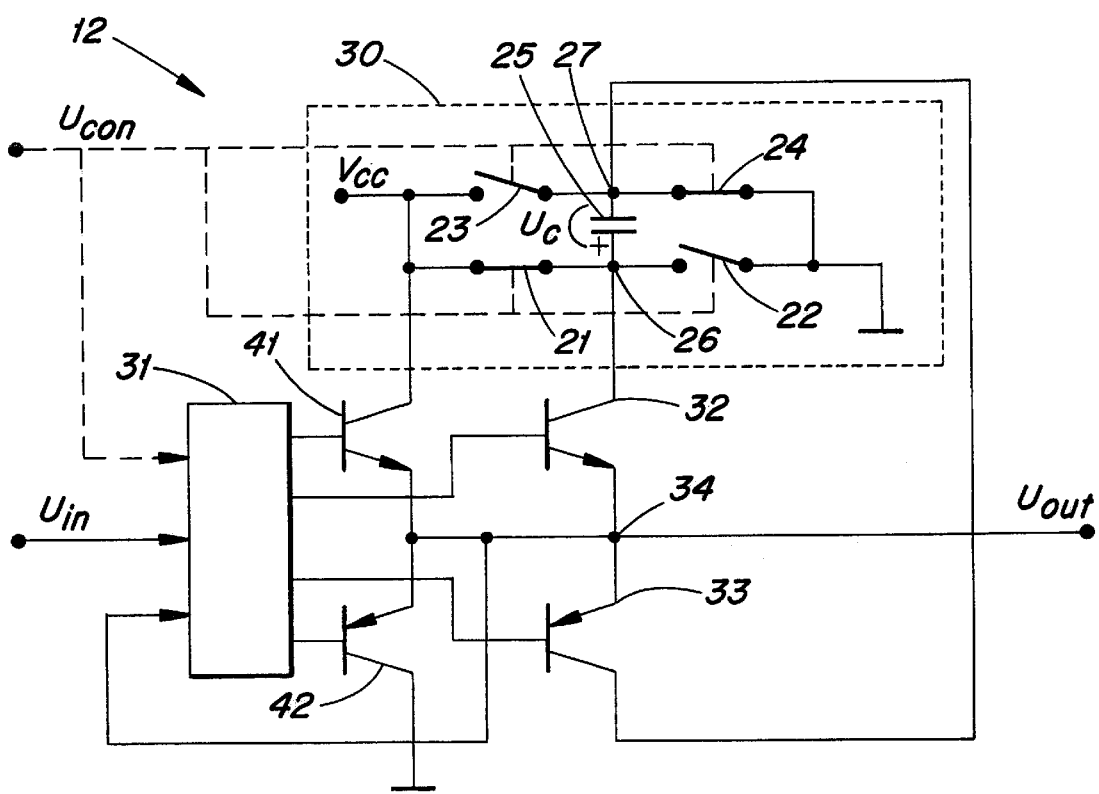
FIG. 6 is a circuit diagram showing a second embodiment of a line driver according to the present invention.

A way of avoiding passing switches when no peak voltage is needed is shown in FIG. 6. FIG. 6 is the same figure as FIG. 5, but with a third transistor 41 and a fourth transistor 42 added in parallel with the first transistors 32, 33. Also for these transistors, the man skilled in the art can use other transistors or equivalent means, to get the same function.

The third transistor 41 is connected with its base to the output of the drive stage 31, with its collector connected to the power supply $V_{cc}$ and with its emitter connected to the third connection point 34. The fourth transistor 42 is connected with its base to the output of the drive stage 31, with its collector connected to ground and with its emitter connected to the third connection point 34.

In this way the third and fourth transistor 41, 42 will be used in the mid voltage range, while the first and second transistor 32, 33 and the voltage-generating block 30 will be used when voltage peaks are needed. Since the switches are only passed when they are necessary, losses are further reduced.

In the figure the third transistor is an NPN-transistor and the fourth transistor is a PNP-transistor. This is only an example. The man skilled in the art can easily use other transistors or equivalent means, to get the same function.

Figure 7:
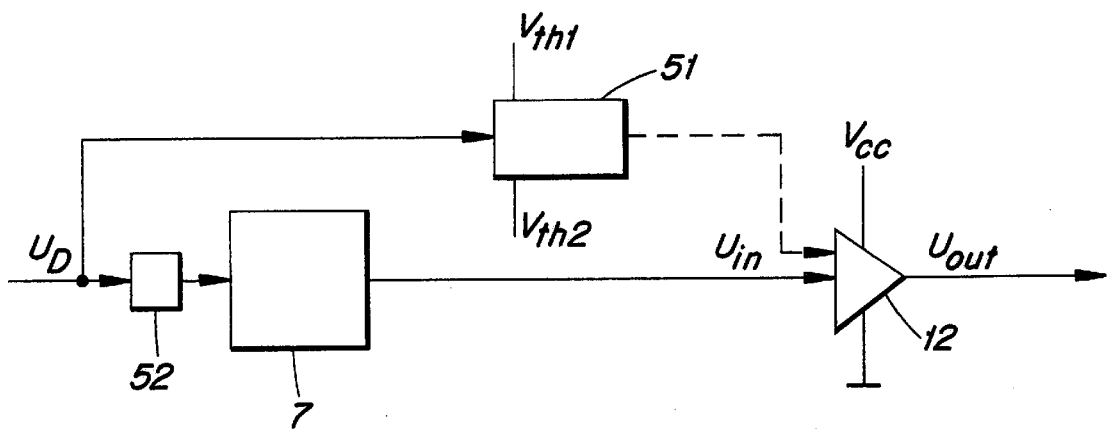
FIG. 7 is a simplified illustration of a first embodiment of a control circuit for the circuits in FIG. 5 or 6.

In order to control the switches and the drive stage, a digital input signal $U_D$ to the digital-to-analogue converter 7 may be used as in FIG. 7. In a digital comparator 51 the digital input signal $U_D$ is compared to a first threshold $V_{th1}$ and a second threshold $V_{th2}$. If the digital input signal $U_D$ is larger than the first threshold $V_{th1}$, then the switches are controlled so as to connect the capacitor to generate a first voltage $V_{max}$, compare FIG. 4b, and the output from the drive stage 31 is adjusted accordingly.

If the digital input signal $U_D$ is lower than the second threshold $V_{th2}$, then the switches are controlled so as to connect the capacitor 25 to generate a second voltage $V_{min}$, compare FIG. 4c, and the output from the drive stage 31 is adjusted accordingly. In the range between the first $V_{th1}$ and the second $V_{th2}$ threshold the capacitor 25 is recharged.

The comparator 51 may be implemented in hardware or software. To ensure that the switches are switched at right time a delay 52 may be introduced before the digital-to analogue converter 7.

Figure 8:
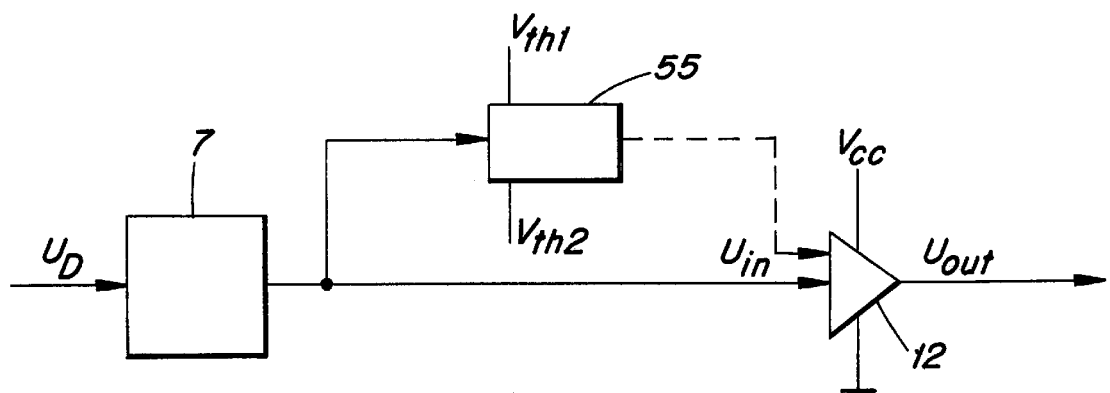
FIG. 8 is a simplified illustration of a second embodiment of a control circuit for the circuits in FIG. 5 or 6.

For the control it is also possible to use the analogue output from the digital-to-analogue converter, see FIG. 8. The compare is in this case made in an analogue comparator 55, but works otherwise as in FIG. 7. This however requires a faster comparison than in FIG. 7.

In practices the thresholds in the different embodiments will not be implemented to correspond to output voltages exactly to 0 V and to the supply voltage, but rather a little higher than 0 V and a little lower than the supply voltage, respectively. This applies particularly in the case with the analogue comparison, where it is an alternative or a complement to having a fast comparison.

Figure 9:
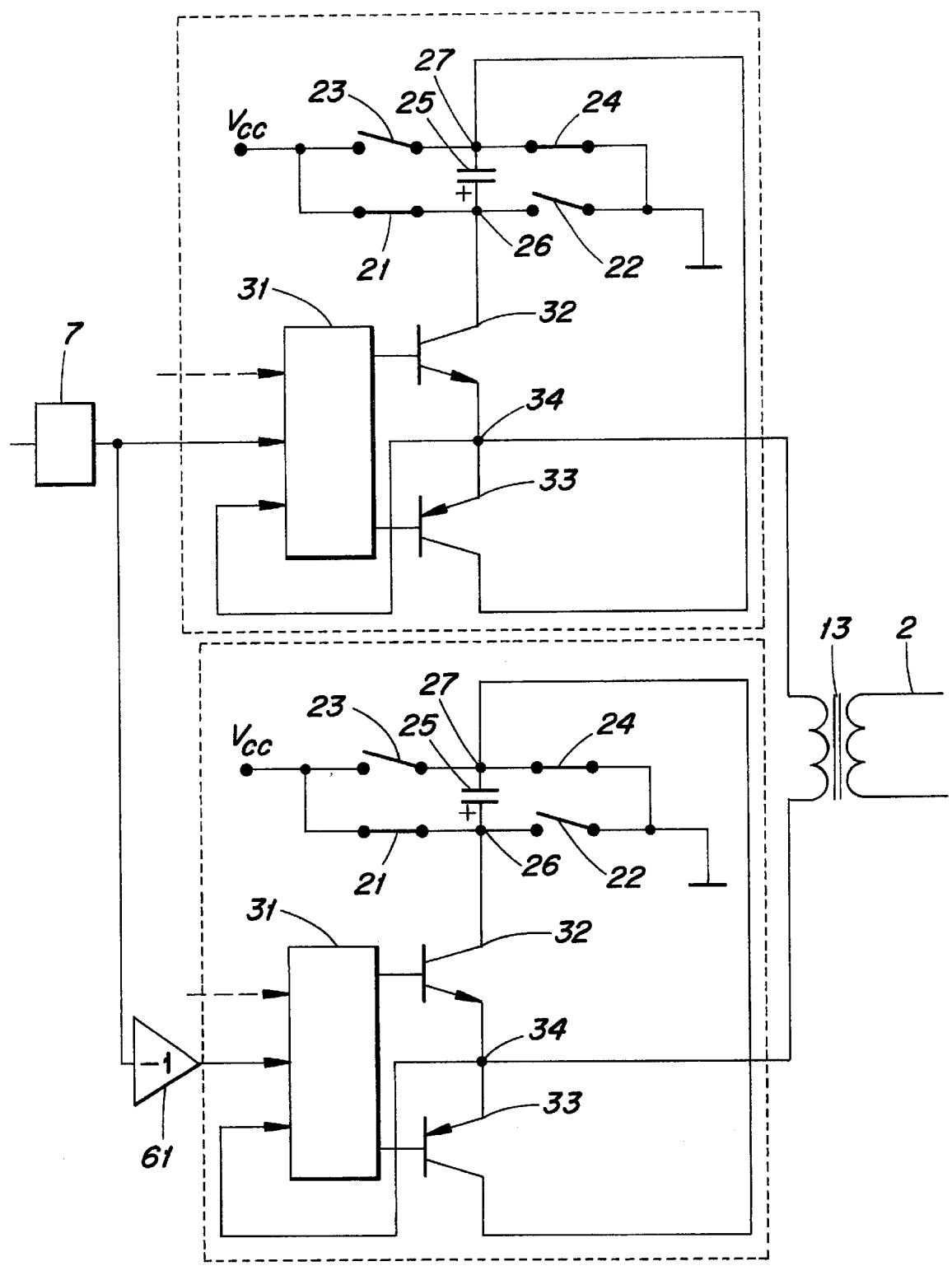
FIG. 9 is a circuit diagram showing a third embodiment of a line driver according to the present invention.

To be able to output a large output voltage range, the line driver may be balanced, which is shown in FIG. 9. Between the digital-to-analogue converter 7 and the output transformer 13 two line drivers are connected with 180° phase difference, which is schematically shown in FIG. 9 as a phase difference block 61. The phase difference may be accomplished before or after one of the line drivers. The total output voltage difference then becomes two times that from a single line driver. In FIG. 9 is shown the embodiment from FIG. 5, but of course the embodiment from FIG. 6 or anything equivalent will do as well.

What is claimed is:

1. Line driver comprising:
   at least one input and at least one output, said line driver being supplied with a power supply voltage from a power supply, and being arranged to amplify an input voltage to an output voltage, where the probability that the input voltage is within a predefined range is higher then the probability that the input voltage is outside said predefined range, wherein the line driver is arranged to use whole or part of the power supply voltage to generate the output voltage if the input voltage is within the predefined range,
   wherein the line driver further includes at least one capacitor, which is arranged to be loaded with at least one capacitor voltage, and
   wherein the line driver is arranged to use whole or part of the at least one capacitor voltage in addition to whole or part of the power supply voltage to generate the output voltage if the input voltage is outside the predefined range.

2. Line driver according to claim 1, wherein the line driver further includes a voltage-generating block, the voltage-generating block includes:

first and second switches connected in series between the power supply and ground, third and fourth switches connected in series between the power supply and ground, and the at least one capacitor connected on one side to a first connection point between the first and second switches and on the other side to a second connection point between the third and fourth switches.

3. Line driver according to claim 2, wherein the line driver further includes:

a drive stage connected to the at least one input, to a first transistor and to a second transistor, wherein the first transistor is connected to the first connection point, wherein the second transistor is connected to the second connection point, and the first and second transistors are connected to the at least one output.

4. Line driver according to claim 3, wherein the line driver further includes:

a third transistor connected to the drive stage and between the power supply and the at least one output; and a fourth transistor connected to the drive stage and between ground and the at least one output.

5. Line driver according to claim 3, wherein the line driver further includes:

a feedback connection between the at least one output and the drive stage.

6. Line driver according to claim 1, wherein the line driver further includes:

a comparator, which is arranged to read the input voltage or a voltage or signal related to the input voltage and to compare it with at least one threshold.

7. Line driver according to claim 1, wherein the line driver is used in a multicarrier modulation system.

8. Line driver according to claim 7, wherein the line driver is connected after a digital-to-analogue converter with at least one input and wherein the signal related to the input voltage is a digital signal which also is arranged to enter the digital-to-analogue converter.

9. Line driver according to claim 8, wherein a delay circuit is provided on the at least one input to the digital-to-analogue converter.

10. Line driver according to claim 7, wherein the line driver is connected after a digital-analogue converter and that the output of the digital-to-analogue converter is connected to the input of a comparator.

11. Amplifying method in a line driver supplied with a power supply voltage from a power supply, in which method an input voltage is amplified to an output voltage and the probability that the input voltage is within a predefined range is higher than the probability that the input voltage is outside said predefined range, the method comprising the steps:

using whole or part of the power supply voltage to generate the output voltage if the input voltage is within the predefined range, loading a capacitor with a capacitor voltage, and using whole or part of the capacitor voltage in addition to whole or part of the power supply voltage to generate the output voltage if the input voltage is outside the predefined range.

12. Amplifying method according to claim 11, wherein the capacitor is included in a voltage-generating block, which further includes first and second switches connected in series between the power supply and ground, third and fourth switches connected in series between the power supply and ground, and the capacitor connected on one side to a first connection point between the first and second switches and on the other side to a second connection point between the third and fourth switches, wherein the following steps are executed:

loading the capacitor by keeping the first and fourth switches closed and the second and third switches opened.

13. Amplifying method according to claim 12, wherein if a voltage outside the predefined range is needed the following steps are executed after loading the capacitor:

opening the first and fourth switches, closing the third switch and keeping the second switch open, and using a voltage potential at the first connection point by the line driver to amplify the input voltage.

14. Amplifying method according to claim 12, wherein if a voltage outside the predefined range is needed the following steps are executed after loading the capacitor:

opening the first and fourth switches, closing the second switch and keeping the third switch open, and using a voltage potential at the second connection point by the line driver to amplify the input voltage.

15. Amplifying method according to claim 11, comprising the following steps:

generating a control signal by reading the input voltage or a voltage or a signal related to the input voltage and making a comparison with at least one threshold, and using the control signal to control the line driver depending on the outcome of the comparison.

16. Amplifying method according to claims 15, wherein the line driver is connected after a digital-to-analogue converter in a multicarrier modulation system, wherein the following step is executed:

using a digital input voltage to the digital-to-analogue converter for the comparison.

17. Amplifying method according to claim 16, further comprising the step of:

delaying the digital input voltage before it enters the digital-to-analogue converter.

18. Amplifying method according to claim 15, wherein the line driver is connected after a digital-analogue converter in a multicarrier modulation system, wherein the following step is executed:

using an analogue output voltage from the digital-to-analogue converter for the comparison.

19. Amplifying method according to claim 18, further comprising the step of:

delaying the analogue output voltage before it enters the line driver.

20. A balanced line driver, wherein the balanced line driver comprises first and second line drivers, the first and second line drivers each comprising:

at least one input and at least one output, said line driver being supplied with a power supply voltage from a power supply, and being arranged to amplify an input voltage to an output voltage, where the probability that the input voltage is within a predefined range is higher then the probability that the input voltage is outside said predefined range, wherein the line driver is arranged to use whole or part of the power supply voltage to generate the output voltage if the input voltage is within the predefined range, wherein the line driver further includes at least one capacitor, which is arranged to be loaded with at least one capacitor voltage, wherein the line driver is arranged to use whole or part of the at least one capacitor voltage in addition to whole or part of the power supply voltage to generate the output voltage if the input voltage is outside the predefined range, and wherein the balanced line driver further comprises a phase difference block connected in series with the second line driver.

* * * * *